Aug. 18, 1964 R. P. MASSEY 3,145,348

TRANSISTOR CONVERTER WITH SELF STARTING CIRCUIT

Filed March 21, 1960

INVENTOR
R. P. MASSEY
BY V. P. Priolo
ATTORNEY

United States Patent Office 3,145,348

Patented Aug. 18, 1964

3,145,348

TRANSISTOR CONVERTER WITH SELF STARTING CIRCUIT

Richard P. Massey, Westfield, N.J., assignor to Bell Telephone Laboratories, Incorporated, New York, N.Y., a corporation of New York Filed Mar. 21, 1960, Ser. No. 16,248

6 Claims. (Cl. 331—113)

Figure 1:
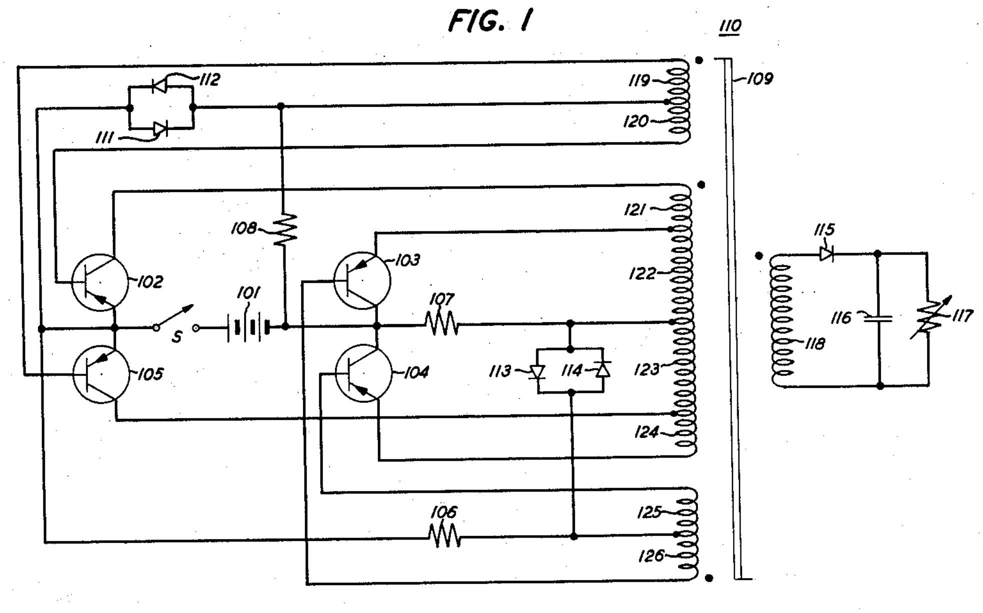

This invention relates to power supply systems, and more particularly, to a system for converting direct current to alternating current which, in turn, may be rectified.

In many electrical and electronic systems ranging in scope for high-fidelity audio to guided missiles, it is important to employ power system which amplify direct current and supply it at a constant amplitude to a given load. Such power supply systems must possess an extremely high degree of reliability with a relatively high order of absolute current stabilization. Power supply systems of the transistor core converter type, which are small, light, efficient, and require no maintenance, possess the required degree of reliability and stability and, therefore, qualify for broad applications.

In the prior art, converter circuits generally employ a plurality of transistors and a saturable transformer for converting direct current to alternating current which may, in turn, be rectified. The transistors function as automatic switches, i.e., conductive or non-conductive, to complete circuits for supplying current from a direct-current source to a portion of a transformer winding alternately in opposite directions. The output is usually supplied through a full-wave rectifier to a load. One rectifier (half-wave) passes current during the conduction of one series of transistors and the other rectifier passes current during the conduction of the other series of transistors. Such circuits are efficient; however, they require power transistors which are presently quite expensive as compared to the cost of signal or low power transistors. Although the use of power transistors may be justified where their full power handling capabilities are required, it is desirable in many applications to have the efficiency of the push-pull circuit arrangement without requiring the power handling capability of a circuit using power transistors. For applications where the power handling capability of a converter employing only power transistors is not required, configurations using high and low power transistors as automatic switches in combination with a half-wave rectifier are employed.

In the two-power transistor symmetric configurations of the prior art, the voltage across the emitter-collector path of the transistor which is not conducting is substantially twice the voltage of the supply source. Therefore, to avoid damage to each of the transistors, the voltage of the direct-current source must be equal to or less than half the maximum safe voltage which can be applied across the emitter-collector path of each of the transistors. This voltage limitation of the direct-current supply source limits the power output of the converter, the power output being substantially proportional to the input supply voltage.

As noted heretofore, the prior art also discloses configurations using power and signal or core reset (low power) transistors in combination with a half-wave rectifier poled to conduct only during the conduction period of the power transistor. In the symmetric power transistor configurations, the transistor primary winding has an equal number of turns and consequently each transistor conducts for half a cycle. In asymmetric configurations the number of turns of the primary winding may be such as to allow the power transistor to conduct for a longer period of time than the lower powered reset transistor.

If a portion of the primary winding has a greater number of turns than the other portion of the primary windings, for example, twice as many, it would take only one-half as much current to saturate the core and, in addition, the rate of change of current required to induce the bias potentials is one-quarter its original value. Accordingly, current will flow in one direction in the primary and secondary windings twice as long as it will flow in the other direction. However, the voltage limitations discussed above in connection with the two-power transistor symmetric configuration are also applicable here. The sum of the direct-current supply voltage and the voltage induced in the winding portion with the larger number of turns must not exceed the maximum safe voltage which can be applied across the emitter-collector path of each transistor.

The converters discussed above have also been seriously limited in the starting capability of the push-pull mode of oscillation under other than light loads. Under small or light load conditions, the inherent slight differences in the characteristics of the components provide a sufficient unbalance to start the push-pull oscillations of the circuit. For example, although the transistors may be of the same conductivity type and have the same rating, the current gain of any one of the transistors will not be equal to the gain of any of the other transistors. The transistor with the higher current gain will be the faster acting, that is, the current in the emitter-collector path will increase at a faster rate, which, as discussed later, is all that is necessary to start the converter's push-pull mode of operation. However, transistor characteristic variations due to temperature effects have made this starting method unreliable and unsatisfactory. For other than light loads, separate starting means have been employed. One common practice is to use a separately excited converter, i.e., a converter controlled by a separate alternating-current driving signal or another converter. In general, it is desirable to have a self-excited converter configuration while maintaining the advantages of reliable starting under all loads, at all temperatures, with maximum transformer winding utilization and optimum power output.

It is, therefore, and object of this invention to provide a self-excited converter with optimum power output.

A further object of this invention is to provide an extended asymmetric converter with an unlimited voltage range.

A further object of this invention is to provide an asymmetric converter with optimum power output.

A further object of this invention is to provide a self-starting extended asymmetric converter with an unlimited voltage range.

A further object of this invention is to provide a self-starting, thermally stabilized asymmetrical converter with extended temperature range.

A further object of this invention is to provide a self-starting, thermally stabilized asymmetric converter with decreased transistor turn-off or decay time.

A further object of this invention is to provide an asymmetric converter with maximum transformer winding utilization.

A further object of this invention is to provide an improved self-starting asymmetric transistor oscillator.

It has been found that these objectives may be achieved by employing novel self-starting transistor converter circuits comprising networks which include asymmetrically conducting devices, proportioned resistors, transformer winding portions, and capacitors.

A feature of this invention resides in the use of additional transistors in asymmetric configurations to increase the input voltage range and hence the power output.

Another feature of this invention resides in the use of capacitor networks to provide a noise-free means for proportioning the input voltage which, in combination with proportioned transformer winding portions, results in optimum power output.

Another feature of this invention resides in the use of proportioned starting networks which interconnect portions of the saturable transformer windings.

Figure 2:
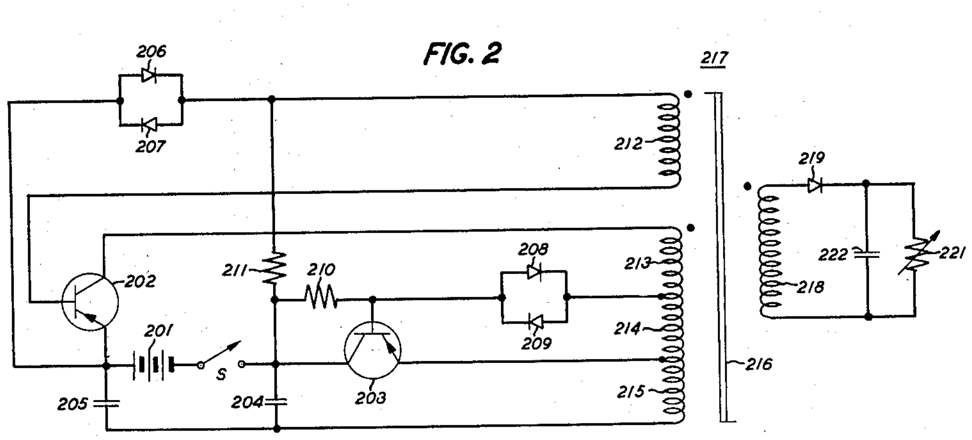

Other objects and features of the present invention become apparent upon consideration of the following detailed description when taken in connection with the accompanying drawings, in which:

FIG. 1 is a schematic representation of an electrical circuit comprising one embodiment of the invention; and FIG. 2 is a schematic representation of an electrical circuit comprising another embodiment of the invention.

Referring now to the drawing, FIG. 1 shows a converter circuit employing pairs of p-n-p transistors. Transistors 102 and 104 are high power transistors while transistors 103 and 105 are low power or core reset transistors. The emitters of transistors 102 and 105 are connected together as are the collectors of transistors 103 and 104. An input direct-current source 101 and switch S are connected in series with the common emitter connection of transistors 102 and 105 and the common collector connection of transistors 103 and 104. There is provided a transformer 110 having winding 118 and winding portions 119, 120, 121, 122, 123, 124, 125, and 126 wound on a core 109 of saturable magnetic material having a substantially rectangular hysteresis loop. The collector of transistor 102, the winding portion 121 and the emitter of transistor 103 are serially connected as are the collector of transistor 105, the winding portion 124 and the emitter of transistor 104. The winding portions 119 and 120, 121 and 122, 122 and 123, 123 and 124, and 125 and 126 have one terminal of each connected together, respectively. The other terminal of winding portion 119 is connected to the base of transistor 105 while the other terminal of winding portion 120 is connected to the base of transistor 102. The other terminal of winding portion 126 is connected to the base of transistor 103 while the other terminal of winding portion 125 is connected to the base of transistor 104. Two oppositely polarized asymmetrically conducting devices 111 and 112 connect the common terminal of winding portions 119 and 120 to the input terminal connecting the emitters of transistors 102 and 105. Resistor 108 connects the common terminal of winding portions 119 and 120 to the input terminal connecting the collectors of transistors 103 and 104. Two oppositely polarized asymmetrically conducting devices 113 and 114 connect the common terminal of winding portions 122 and 123 to the common terminal of winding portions 125 and 126. Resistor 107 connects the common terminal of winding portions 122 and 123 to the common collector connection of transistors 103 and 104. Resistor 106 connects the common terminal of winding portions 125 and 126 to the common emitter connection of transistors 102 and 105.

The alternating current induced in the transformer secondary winding 118 is rectified by half-wave rectifier 115 having a filter capacitor 116 connected across the output terminals. The rectified current is supplied from the output terminals to a variable load 117.

To start a converter it appears to be necessary only to apply a base-to-emitter bias to the transistors in one pair of transistors. It has been found, however, that this method is unreliable. For maximum starting reliability, such as in the configuration of FIG. 1, it is necessary to apply a base-to-emitter bias to each of the transistors. Although all the transistors are of the same conductivity type, the current gain of any one of the transistors will not be equal to the gain of any of the other transistors. The transistor with the higher current gain will be faster acting, that is, the current in the emitter-collector path will increase at a higher rate, which is all that is necessary to start the converter's push-pull mode of operation. Only very slight variations in transistor characteristics are necessary since each transistor is biased "on." Once the converter is in its push-pull mode of oscillation the starting means may be removed. Two such starting networks are shown in FIG. 1. The starting network for transistors 102 and 105 and the starting network for transistors 103 and 104 are slightly different since it has been found that if symmetrical starting networks are used, i.e., the starting network for transistors 103 and 104 is identical to the starting network for transistors 102 and 105, the inverse collector-to-base voltage across the transistor electrodes is a multiple of the input voltage. The maximum allowable input voltage will, therefore, have to be a fraction of the inverse collector-to-base voltage rating, thereby destroying the primary advantage of the configuration, as discussed later.

The starting network for transistors 102 and 105 comprises the resistor 108 and the asymmetrically conducting device 111. At the instant of closing the switch S applying the input direct-current voltage 101 there is no bias voltage induced in windings 119 and 120. The asymmetrically conducting device 111 is thus biased in a forward direction, and a small voltage drop is established across the asymmetrically conducting device due to its inherent internal resistance. The sum of the voltage drops across the asymmetrically conducting device 111 and resistor 108 is equal to the input direct-current voltage 101. The relatively small voltage drop across the asymmetrically conducting device 111 biases the emitter-to-base junction of transistors 102 and 105 and renders them conducting. Thus, the self-starting feature is achieved.

The initially forward biased asymmetrically conducting device 111 minimizes the temperature dependence of the loop gain thereby insuring self-starting over wide temperature ranges. If the asymmetrically conducting device 111 is constructed of the same semiconductor material as the transistors to be thermally compensated, then the required temperature dependent voltage for thermal stabilization at the lower temperatures is provided by the asymmetrically conducting device 111.

As described hereinafter, once the circuit is oscillating, the voltage induced in winding portion 119 or 120 forward biases the initially reverse biased asymmetrically conducting device 112 to remove the starting bias. The device 112 also decreases the turn-off or decay time of the previously conducting transistor, 102 or 105. As in the case of the asymmetrically conducting device 111, if the asymmetrically conducting device 112 and the transistors are made of the same semiconductor material, then the required temperature dependent current for thermal stabilization at the higher temperatures is provided by the asymmetrically conducting device 112. The use of the double asymmetrically conducting device network comprising symmetrically conducting devices 111 and 112, polarized in opposite directions, increases both the lower and higher limits of the operating temperature range.

The starting network for transistors 103 and 104 comprises resistors 106 and 107 and the asymmetrically conducting devices 113 and 114. As in the case of the asymmetrically conducting device 111, the asymmetrically conducting device 114 has a small voltage drop across it due to its internal resistance. This voltage drop, in turn, biases the emitter-to-base junctions of transistors 103 and 104. The oppositely polarized asymmetrically conducting device 113 is provided, as was the asymmetrically conducting device 112, to remove the starting bias and to decrease transistor turn-off or decay time.

Optimum operation appears to be achieved when the starting network for transistors 103 and 104 comprises two resistors the sum of whose values is equal to the value of the resistor in the starting network of transistors 102 and 105. For example, in the circuit of FIG. 1, the value of each of the starting resistors 106 and 107 is $R/2$ while the value of the starting resistor 108 is R.

A combination of the center-tapped portions of the primary and feedback windings with the "split" starting resistors (106 and 107) insures equal voltage division across the electrodes of the transistors, thereby providing maximum input voltage capability of the converter configuration.

In the circuit of FIG. 1, once the circuit is started transistors 102 and 104, for example, will be substantially fully conductive during intermittent periods determined by the saturable transformer turns ratio and transistors 103 and 105 will be substantially fully conductive during intervals separating the intermittent periods. When power transistors 102 and 104 are conductive, current flows from the direct-current supply source 101 through the collector-emitter path of transistor 102, through winding portions 121, 122, 123 and 124 and through the emitter-collector path of transistor 104 back to the input direct-current supply source 101. When power transistors 102 and 104 are substantially non-conductive and core reset transistors 103 and 105 are substantially conductive, current flows from the direct-current supply source 101 through the collector-emitter path of transistor 105, through winding portions 123 and 122 and through the collector-emitter path of transistor 103 back to the input direct-current supply source 101. It should be noted that the current in winding portions 123 and 122 reverses in direction. As shown by the dot convention of the windings, the voltage induced in each of the windings will change in direction with the current change in winding portions 123 and 122. The voltages induced in the combination of winding portions 119, 120 and the combination of winding portions 121, 122, 123, 124, 125 and 126 bias the base-emitter electrodes of each of the transistors 102, 103, 104 and 105. The polarity and the varying magnitude of the base-emitter bias determines whether any particular transistor is being driven toward cut-off or saturation. For example, if the base-to-emitter bias of power transistors 102 and 104 is such that there is a small current flow through the collector-emitter path of the transistors, current will flow into the dot of winding portions 121, 122, 123 and 124. This current flow will, in turn, due to the effects of the magnetic flux established, induce larger emitter-to-base bias voltages—thus rendering power transistors 102 and 104 more conductive and driving core reset transistors 103 and 105 further into cut-off. This cyclic process continues until the current flow into winding portions 121, 122, 123 and 124 reaches such a value that the saturable transformer core 109 is saturated and no further change of flux can occur. At this point, since no further change of flux can occur, the voltage induced in the base-emitter bias winding falls to zero, hence the collector-emitter current flow is reduced to zero which, in turn, causes the flux in the saturable transformer to collapse. The collapsing flux induces a voltage in winding portions 119, 120, and winding portions 121, 122, 123, 124, 125 and 126 in the opposite direction to the previous base-to-emitter bias voltage. This new bias voltage causes core reset transistors 103 and 105 to conduct and cut off power transistors 102 and 104. The current flow in the winding portions 122 and 123 is now in the opposite direction to the direction of flow when power transistors 102 and 104 were conducting. This current, as before, induces larger base-to-emitter bias voltages rendering core reset transistors 103 and 105 more conductive and driving transistors 102 and 104 further into cut-off. This process again continues until the saturable transformer core 109 becomes saturated and the cycle repeats itself. The oscillatory cycles will continue until the input direct-curernt supply 101 is removed.

As shown by the dot convention, current will be supplied to the variable load 117 only when transistors 102 and 104 are conducting because of the direction in which recitifier 115 is poled. Thus, when transistors 103 and 105 are conducting, the secondary 118 is effectively an open circuit, hence the core reset transistors 103 and 105 need only have a current carrying capacity sufficient to supply the necessary excitation current. Power transistors 102 and 104 however, must have sufficient current carrying capacity to supply the load. As noted earlier, by proportioning the saturable transformer turns ratio, it is possible to obtain other than equal duty cycles between the power and core reset transistors, hence by letting the power transistors conduct for a longer period of time than the core reset transistors, larger power outputs may be obtained.

As discussed earlier, the input voltage of the two-transistor asymmetric converter of the prior art was limited to a fraction of the transistor collector-emitter voltage rating. In the configuration of FIG. 1, the voltage across the collector-emitter terminals of each of the non-conducting transistors will be substantially equal to the voltage of the supply source. In order to avoid damage to the transistors in the embodiment shown in FIG. 1, it is generally only necessary to limit the direct-current voltage source to a value which is equal to or less than the maximum safe voltage which can be applied across the collector-emitter path of each transistor. The addition of $n$ series transistors with appropriate additional windings in the configuration of FIG. 1 will increase the input voltage range to $n/2$ times the maximum safe voltage which can be applied across the collector-emitter path of each transistor. This is, of course, limited to the case where each pair of transistors has an equal number of turns on the saturable transformer, hence the pairs have equal duty cycles. In asymmetric configurations with unequal duty cycles, the voltages induced by the unbalance in the turns ratios must be considered.

It should be noted that the configuration of FIG. 1, in addition to providing larger power output requires less turns in the primary winding of the saturable inductance device, thus providing greater transformer winding utilization.

Although the foregoing discussion has been limited to an asymmetric converter, it should be understood that the core reset transistors may be replaced by power transistors with the configuration designed so that the additional transistors operate on an equal duty cycle basis with power transistors 102 and 104.

The circuit of FIG. 2 uses an individual starting, thermal stabilization, and decreased transistor turn-off or decay time network for each of the transistors in the configuration. As shown in the drawing, the starting, thermal stabilization and decreased transistor turn-off or decay time network for transistor 202 comprises asymmetrically conducting devices 206 and 207 and resistor 211, while the similar network for transistor 203 comprises asymmetrically conducting devices 208 and 209 and resistor 210. Each of these devices functions in the same manner as the starting, thermal stabilization, and decreased transistor turn-off or decay time network of transistors 102 and 105 in FIG. 1. Since capacitors 204 and 205 charge almost instantaneously after the switch S is closed, the common connection between the capacitors is at a potential sufficient to bias the asymmetrically conducting device 209 into conduction simultaneously with the conduction of asymmetrically conducting device 206. Once the circuit of FIG. 2 is started, i.e., oscillating, its push-pull mode of operation is the same as that described in connection with FIG. 1. The characteristics and description of the saturable transformer 217 with a saturable core 216 and a secondary winding 218, which has a half-wave rectifier 219 with a filter 222 attached to a variable load 221 of FIG. 2, are substantially the same as the equivalent components 110, 109, 118, 115, 116, and 117, respectively, of FIG. 1.

The principal difference between the configurations of FIGS. 1 and 2 lies in the substitution of capacitors 204 and 205 for transistors 104 and 105, respectively. The function of these capacitors will be readily understood from the description of the operation of FIG. 2 which follows. In the interest of clarity, the description of the operation assumes that the values of the capacitors 204 and 205 are equal.

Assuming that the circuit is started as described heretofore and that transistor 202 is conducting, current flows from the direct-current source 201 through the collector-emitter path of transistor 202, into the dot of winding portions 213, 214 and 215 and through capacitor 204 back to the direct-current supply source 201. Thus capacitor 204 is charged to a value of voltage substantially equal to half the voltage of the direct-current supply source 201. As described in connection with FIG. 1, when the saturable core 216 is saturated, transistor 202 will stop conducting and transistor 203 will start conducting. When transistor 203 is conducting, current flows from the direct-current source 201, through capacitor 205, out of the dot of winding portion 215, through the emitter-collector path of transistor 203 and back to the direct-current supply source 201. Note that capacitor 205 is now also charged to a value of voltage substantially equal to half the voltage of the direct-current supply source 201. Subsequently, transistor 202 will again conduct and transistor 203 will stop conducting, thus enabling capacitor 204 to discharge through the direct-current path described above when transistor 202 is conducting. The current in this path is now twice the value of the current obtained in the configuration of FIG. 1 with transistor 104 conducting. Thus, replacing the transistor with a capacitor effectively doubles the prior art two-transistor converter power output. In addition to the increased power level, the capacitors also provide means for effectively center-tapping the direct-current voltage supply source into two exactly balanced halves, a feature which was heretofore impossible in converter configurations. Moreover, the capacitors also filter noise which is incurred in the use of central battery supplies such as a telephone central office battery where noise requirements are minimal.

Although in the above example capacitor values are assumed to be equal, this is not a requirement. Unequal capacitor values in asymmetric configurations also appear to extend the power levels. It has been found that maximum power output is obtained when the values of the capacitors 204 and 205 are slightly unequal and the total number of turns of winding portions 213, 214 and 215 are three times the number of turns of winding portion 215.

In addition, it has been found that connecting resistor 211 to the common terminal of capacitors 204 and 205 will reduce the power loss in resistor 211 to substantially half the loss incurred in the configuration of FIG. 2.

The foregoing discussion has been limited to asymmetric converters. It should be understood, however, that the core reset transistor may be replaced by a power transistor with the configuration designed so that the additional transistor operates on an equal duty cycle basis with transistor 202. As discussed above, because of the addition of the capacitors 204 and 205 the configuration will have twice the power output of the two-power transistor configurations of the prior art.

Although the configurations heretofore described use p-n-p transistors, it should be understood that n-p-n or combinations of n-p-n and p-n-p could be used as effectively.

Since changes may be made in the above-described arrangement, and different embodiments may be devised by those skilled in the art without departing from the spirit and scope of the invention, it is to be understood that all matter contained in the foregoing description and accompanying drawings is illustrative of the application of the principles of the invention, and is not to be construed in a limiting sense.

What is claimed is:

1. In a power supply system, a transformer having a saturable core with first, second, and third windings wound thereon, said first winding having first and second end terminals and third, fourth, and fifth terminals intermediate to said first and second end terminals, said second and third windings each having first and second end terminals and a third terminal intermediate to said first and second end terminals, a source of input potential having first and second terminals, first, second, third, and fourth transistors each having base, collector and emitter electrodes, said first and second transistors capable of passing large currents, said third and fourth transistors capable of passing only small currents, means for connecting the emitter electrodes of said first and fourth transistors to said first terminal of said source of input potential, means for connecting the collector electrodes of said second and third transistors to said second terminal of said source of input potential, means for connecting the collector electrode of said first transistor to the first end terminal of said first winding, means for connecting the emitter electrode of said second transistor to the second end terminal of said first winding, means for connecting the emitter electrode of said third transistor to the third intermediate terminal of said first winding, means for connecting the collector electrode of said fourth transistor to the fourth intermediate terminal of said first winding, means for connecting the base electrode of said fourth transistor to the first end terminal of said second winding, means for connecting the base electrode of said first transistor to the second end terminal of said second winding, means for connecting the base electrode of said second transistor to the first end terminal of said third winding, means for connecting the base electrode of said third transistor to the second end terminal of said third winding, means for connecting the third intermediate terminals of both said second and third windings to the first terminal of said source of input potential, means for connecting the fifth intermediate terminal of said first winding to the second terminal of said source of input potential, and means for connecting the third intermediate terminal of said third winding to the fifth intermediate terminal of said first winding whereby said first and second transistors are rendered simultaneously conductive during intermediate periods and said third and fourth transistors are rendered conductive during intervals separating said periods.

2. In a power supply system, a transformer having a saturable core with first, second, and third windings wound thereon, said first winding having first and second end terminals and third, fourth, and fifth terminals intermediate to said first and second end terminals, said second and third windings each having first and second end terminals and a third terminal intermedite to said first and second end terminals, a source of input potential having first and second terminals, first, second, third, and fourth transistors each having base, collector, and emitter electrodes, said first and second transistors capable of passing large currents, said third and fourth transistors capable of passing only small currents, transistor and starting stabilizing means comprising first and second asymmetrically conducting devices and first, second, and third resistors, each of said first and second asymmetrically conducting devices having first and second terminals, each of said first, second, and third resistors having first and second terminals, means for connecting the emitter electrodes of said first and fourth transistors to said first terminal of said source of input potential, means for connecting the collector electrodes of said second and third transistors to said second terminal of said source of input potential, means for connecting the collector electrode of said first transistor to the first end terminal of said first winding, means for connecting the emitter electrode of said second transistor to the second end terminal of said first winding, means for connecting the emitter electrode of said third transistor to the third intermediate terminal of said first winding, means for connecting the collector electrode of said fourth transistor to the fourth intermediate terminal of said first winding, means for connecting the base electrode of said fourth transistor to the first end terminal of said second winding, means for connecting the base electrode of said first transistor to the second end terminal of said second winding, means for connecting the base electrode of said second transistor to the first end terminal of said third winding, means for connecting the base electrode of said third transistor to the second end terminal of said third winding, means for connecting the first terminal of said first asymmetrically conducting device to the third intermediate terminal of said second winding, means for connecting the second terminal of said first asymmetrically conducting device to said first terminal of said source of input potential, means for connecting the first terminal of said first resistor to the third intermediate terminal of said third winding, means for connecting the second terminal of said first resistor to said first terminal of said source of input potential, means for connecting the first terminal of said second resistor to the fifth intermediate terminal of said first winding, means for connecting the second terminal of said second resistor to said second terminal of said source of input potential, means for connecting the first terminal of said third resistor to the second terminal of said input source, means for connecting the second terminal of said third resistor to the third intermediate terminal of said second winding, means for connecting the first terminal of said second asymmetrically conducting device to the fifth intermediate terminal of said first winding, and means for connecting the second terminal of said second asymmetrically conducting device to the third intermediate terminal of said third winding.

3. A power supply system in accordance with claim 2 wherein an individually oppositely polarized asymmetrically conducting device is connected across each of said first and second asymmetrically conducting devices whereby decreased transistor turn off or decay time and increased thermal stabilization are provided.

4. In a power supply system, a transformer having a saturable core with first and second windings wound thereon, said first winding having first and second end terminals and third and fourth terminals intermediate said first and second end terminals, said second winding having first and second end terminals, a source of input potential having first and second terminals, first and second transistors each having base, collector, and emitter electrodes, first and second capacitors each having first and second terminals, means for connecting the emitter electrode of said first transistor and the first terminal of said first capacitor to said first terminal of said source of input potential, means for connecting the collector electrode of said second transistor and the first terminal of said second capacitor to said second terminal of said source of input potential, means for connecting the second terminal of said first capacitor to the second terminal of said second capacitor, means for connecting the collector electrode of said first transistor to the first end terminal of said first winding, means for connecting the second terminal of said first capacitor to the second end terminal of said first winding, means for connecting the emitter electrode of said first transistor to the first end terminal of said second winding, means for connecting the base electrode of said first transistor to the second end terminal of said second winding, means for connecting the emitter electrode of said second transistor to the third intermediate terminal of said first winding, and means for connecting the base electrode of said second transistor to the fourth intermediate terminal of said first winding.

5. In a power supply system, a transformer having a saturable core with first and second windings wound thereon, said first winding having first and second end terminals and third and fourth terminals intermediate to said first and second end terminals, said second winding having first and second end terminals, a source of input potential having first and second terminals, first and second transistors each having base, collector, and emitter electrodes, first and second capacitors each having first and second terminals, starting and stabilizing means comprising first and second asymmetrically conducting devices and first and second resistors, each of said first and second asymmetrically conducting devices and said first and second resistors having first and second terminals, means for connecting the emitter electrode of said first transistor and the first terminal of said first capacitor to said first terminal of said source of input potential, means for connecting the collector electrode of said second transistor and the first terminal of said second capacitor to said second terminal of said source of input potential, means for connecting the second terminal of said first capacitor to the second terminal of said second capacitor, means for connecting the collector electrode of said first transistor to the first end terminal of said first winding, means for connecting the second terminal of said first capacitor to the second end terminal of said first winding, means for connecting the base electrode of said first transistor to the second end terminal of said second winding, means for connecting the base electrode of said second transistor to both the first terminal of said first resistor and the first terminal of said first asymmetrically conducting device, means for connecting the second terminal of said first asymmetrically conducting device to the fourth intermediate terminal of said first winding, means for connecting the second terminal of said first resistor to said second terminal of said source of input potential, means for connecting the first terminal of said second resistor to said second terminal of said source of input potential, means for connecting the second terminal of said second resistor to the first end terminal of said second winding, means for connecting the first terminal of said second asymmetrically conducting device to said first terminal of said source of input potential, and means for connecting the second terminal of said second asymmetrically conducting device to the first end terminal of said second winding.

6. A power supply system in accordance with claim 5 wherein an individual oppositely polarized asymmetrically conducting device is connected across each of said first and second asymmetrically conducting devices whereby decreased transistor turn off or decay time and increased thermal stabilization are provided.

References Cited in the file of this patent

UNITED STATES PATENTS

| | | |
|---|---|---|
| 2,773,200 | Guggi | Dec. 4, 1956 |
| 2,783,384 | Bright et al. | Feb. 26, 1957 |
| 2,826,731 | Paynter | Mar. 11, 1958 |
| 2,872,582 | Norton | Feb. 3, 1959 |
| 2,931,991 | Schultz | Apr. 5, 1960 |
| 2,975,353 | Rockstuhl | Mar. 14, 1961 |
| 3,015,771 | Mesenhimer | Jan. 2, 1962 |

OTHER REFERENCES

Article by Pye in Electronic & Radio Engineer, March 1959, pages 96–105.